(12) United States Patent
Lu et al.

(10) Patent No.: US 9,972,753 B2
(45) Date of Patent: May 15, 2018

(54) WAVELENGTH CONVERTING LIGHT-EMITTING DEVICES AND METHODS OF MAKING THE SAME

(75) Inventors: Hong Lu, Wayland, MA (US); Michael Lim, Lexington, MA (US); Hao Zhu, Tewksbury, MA (US)

(73) Assignee: Luminus Devices, Inc., Woburn, MA (US)

( * ) Notice: Subject to any disclaimer, the term of this patent is extended or adjusted under 35 U.S.C. 154(b) by 0 days. days.

(21) Appl. No.: 13/526,011

(22) Filed: Jun. 18, 2012

(65) Prior Publication Data

US 2013/0017634 A1  Jan. 17, 2013

Related U.S. Application Data

(62) Division of application No. 12/355,559, filed on Jan. 16, 2009, now abandoned.

(60) Provisional application No. 61/021,449, filed on Jan. 16, 2008.

(51) Int. Cl.
*H01L 33/50* (2010.01)
*H01L 21/027* (2006.01)
*H01L 33/56* (2010.01)

(52) U.S. Cl.
CPC ............ *H01L 33/505* (2013.01); *H01L 33/56* (2013.01); *H01L 2933/0041* (2013.01)

(58) Field of Classification Search
CPC ........ H01L 2933/0041; H01L 33/005–33/346; H01L 33/50–33/502; H01L 33/504–33/505

USPC .... 438/22–35, 38–39, 45–47, 110, 112, 116, 438/577, 956; 257/9–15, 21, 51, 79–83, 257/88–91, 94–103, 184, 414, 431, 440, 257/451, E51.018–E51.022, 257/E33.013–E33.017, E33.022–E33.034, 257/E33.045, E33.049, E33.054–E33.055, 257/E33.067, E27.122, E33.001–E33.002
See application file for complete search history.

(56) References Cited

U.S. PATENT DOCUMENTS

| | | | |
|---|---|---|---|
| 5,871,826 A * | 2/1999 | Mei | H01L 21/22 257/E21.134 |
| 5,959,316 A | 9/1999 | Lowery | |
| 5,998,925 A | 12/1999 | Shimizu et al. | |
| 6,252,254 B1 | 6/2001 | Soules et al. | |
| 6,277,301 B1 | 8/2001 | Höhn et al. | |
| 6,351,069 B1 | 2/2002 | Lowery et al. | |
| 6,366,018 B1 | 4/2002 | Garbuzov et al. | |
| 6,404,125 B1 | 6/2002 | Garbuzov et al. | |
| 6,417,019 B1 | 7/2002 | Mueller et al. | |
| 6,498,426 B1 * | 12/2002 | Watabe | B82Y 10/00 313/310 |
| 6,544,438 B2 | 4/2003 | Yocom et al. | |
| 6,580,097 B1 | 6/2003 | Soules et al. | |
| 6,600,175 B1 | 7/2003 | Baretz et al. | |
| 6,603,258 B1 | 8/2003 | Mueller-Mach et al. | |
| 6,635,363 B1 * | 10/2003 | Duclos et al. | 428/690 |
| 6,642,652 B2 | 11/2003 | Collins, III et al. | |
| 6,661,823 B1 * | 12/2003 | Otoma et al. | 372/49.01 |
| 6,682,207 B2 | 1/2004 | Weber et al. | |

(Continued)

*Primary Examiner* — Maliheh Malek
(74) *Attorney, Agent, or Firm* — Wolf, Greenfield & Sacks, P.C.

(57) ABSTRACT

Wavelength converting light-emitting devices and methods of making the same are provided. In some embodiments, the devices include a phosphor material region designed to convert the wavelength of emitted light.

21 Claims, 10 Drawing Sheets

(56) References Cited

U.S. PATENT DOCUMENTS

| | | | |
|---|---|---|---|
| 6,686,691 B1 | 2/2004 | Mueller et al. | |
| 6,783,700 B2 | 8/2004 | Tian et al. | |
| 6,809,347 B2 | 10/2004 | Tasch et al. | |
| 6,812,500 B2 | 11/2004 | Reeh et al. | |
| 6,821,799 B2* | 11/2004 | Steckl et al. | 438/22 |
| 6,831,302 B2 | 12/2004 | Erchak et al. | |
| 6,850,002 B2 | 2/2005 | Danielson et al. | |
| 6,943,380 B2 | 9/2005 | Ota et al. | |
| 7,049,159 B2* | 5/2006 | Lowery | 438/22 |
| 7,078,732 B1 | 7/2006 | Reeh et al. | |
| 7,084,434 B2 | 8/2006 | Erchak et al. | |
| 7,138,660 B2 | 11/2006 | Ota et al. | |
| 7,157,746 B2 | 1/2007 | Ota et al. | |
| 7,183,577 B2 | 2/2007 | Mueller-Mach et al. | |
| 7,187,011 B2 | 3/2007 | Tasch et al. | |
| 7,196,354 B1* | 3/2007 | Erchak et al. | 257/79 |
| 7,227,190 B2 | 6/2007 | Yasukawa et al. | |
| 7,267,787 B2 | 9/2007 | Dong et al. | |
| 7,311,858 B2 | 12/2007 | Wang et al. | |
| 7,368,179 B2 | 5/2008 | Tian et al. | |
| 7,427,366 B2 | 9/2008 | Tian et al. | |
| 7,646,033 B2* | 1/2010 | Tran et al. | 257/94 |
| 7,781,241 B2* | 8/2010 | Ando et al. | 438/26 |
| 7,795,600 B2* | 9/2010 | Beeson et al. | 250/483.1 |
| 7,846,755 B2* | 12/2010 | Kal et al. | 438/34 |
| 7,847,302 B2* | 12/2010 | Basin et al. | 257/88 |
| 7,863,635 B2* | 1/2011 | Andrews et al. | 257/98 |
| 7,910,387 B2* | 3/2011 | Chao | 438/26 |
| 8,058,088 B2* | 11/2011 | Cannon et al. | 438/48 |
| 8,207,551 B2* | 6/2012 | Hsieh et al. | 257/98 |
| 8,299,491 B2* | 10/2012 | Chao | 257/99 |
| 8,330,176 B2* | 12/2012 | Thompson et al. | 257/98 |
| 8,349,628 B2* | 1/2013 | Chen et al. | 438/27 |
| 8,399,268 B1* | 3/2013 | Mei et al. | 438/22 |
| 8,410,517 B2* | 4/2013 | Kwon et al. | 257/100 |
| 8,492,182 B2* | 7/2013 | Von Malm | H05B 33/10 257/88 |
| 2003/0020084 A1* | 1/2003 | Fan | G02B 27/0093 257/92 |
| 2003/0107318 A1* | 6/2003 | Aoki | C09K 11/7734 313/582 |
| 2003/0203524 A1* | 10/2003 | Farahi et al. | 438/26 |
| 2004/0021229 A1 | 2/2004 | Kinsman | |
| 2004/0178417 A1* | 9/2004 | Andrews | 257/93 |
| 2005/0018098 A1* | 1/2005 | Sugihara et al. | 349/49 |
| 2006/0076571 A1* | 4/2006 | Hsieh et al. | 257/99 |
| 2006/0119669 A1* | 6/2006 | Sharma | B41J 2/03 347/82 |
| 2006/0261292 A1* | 11/2006 | Kim | H01L 24/24 250/551 |
| 2007/0001178 A1* | 1/2007 | Tran et al. | 257/79 |
| 2007/0108467 A1* | 5/2007 | Jang et al. | 257/103 |
| 2007/0125982 A1 | 6/2007 | Tian et al. | |
| 2007/0190886 A1* | 8/2007 | Satoh | H01J 9/02 445/24 |
| 2007/0221867 A1* | 9/2007 | Beeson | H05B 33/10 250/487.1 |
| 2007/0241356 A1* | 10/2007 | Hsieh | 257/98 |
| 2007/0284567 A1* | 12/2007 | Pokrovskiy et al. | 257/13 |
| 2007/0285000 A1* | 12/2007 | Lim et al. | 313/501 |
| 2008/0019147 A1* | 1/2008 | Erchak et al. | 362/607 |
| 2008/0042153 A1* | 2/2008 | Beeson et al. | 257/94 |
| 2008/0067533 A1* | 3/2008 | Lim et al. | 257/98 |
| 2008/0128727 A1* | 6/2008 | Erchak et al. | 257/98 |
| 2008/0128728 A1* | 6/2008 | Nemchuk et al. | 257/98 |
| 2008/0135861 A1* | 6/2008 | Pokrovskiy et al. | 257/98 |
| 2008/0290351 A1* | 11/2008 | Ajiki | H01L 25/0753 257/88 |
| 2009/0034230 A1* | 2/2009 | Lim et al. | 362/84 |
| 2009/0034292 A1* | 2/2009 | Pokrovskiy et al. | 362/617 |
| 2009/0035885 A1* | 2/2009 | Karlicek et al. | 438/45 |
| 2009/0040745 A1* | 2/2009 | Nemchuk | 362/84 |
| 2009/0062913 A1* | 3/2009 | Saggere | A61M 35/00 623/6.63 |
| 2009/0315050 A1* | 12/2009 | Lee | 257/98 |
| 2010/0051977 A1* | 3/2010 | Kim et al. | 257/93 |
| 2010/0072489 A1* | 3/2010 | McLaurin et al. | 257/88 |
| 2010/0148198 A1* | 6/2010 | Sugizaki et al. | 257/98 |
| 2010/0151604 A1* | 6/2010 | Kal et al. | 438/29 |
| 2010/0181582 A1* | 7/2010 | Li et al. | 257/91 |
| 2010/0219767 A1* | 9/2010 | Pumyea et al. | 315/291 |
| 2010/0283036 A1* | 11/2010 | Coe-Sullivan et al. | 257/13 |
| 2010/0295077 A1* | 11/2010 | Melman | 257/98 |
| 2010/0308361 A1* | 12/2010 | Beeson et al. | 257/98 |
| 2011/0001157 A1* | 1/2011 | McKenzie et al. | 257/98 |
| 2011/0042705 A1* | 2/2011 | Edmond | 257/98 |
| 2011/0086453 A1* | 4/2011 | Kim et al. | 438/31 |
| 2011/0121347 A1* | 5/2011 | Liu | H01L 33/641 257/99 |
| 2011/0156579 A1* | 6/2011 | Jo | H01L 33/38 313/506 |
| 2011/0215355 A1* | 9/2011 | van de Ven et al. | 257/98 |
| 2011/0263128 A1* | 10/2011 | Duncan | H01L 21/30612 438/745 |
| 2012/0032184 A1* | 2/2012 | Tran et al. | 257/76 |
| 2013/0309792 A1* | 11/2013 | Tischler | H01L 33/0079 438/28 |
| 2013/0313594 A1* | 11/2013 | Han | H01L 33/62 257/98 |
| 2014/0057375 A1* | 2/2014 | Miller | H01L 33/505 438/29 |
| 2016/0043271 A1* | 2/2016 | Moosburger | H01L 33/0095 438/29 |
| 2016/0126434 A1* | 5/2016 | Nakabayashi | F21S 48/1195 315/82 |
| 2016/0133802 A1* | 5/2016 | Richter | H01L 33/50 427/58 |
| 2016/0372893 A1* | 12/2016 | McLaurin | H01L 24/83 |
| 2017/0062676 A1* | 3/2017 | Kondo | H01L 33/58 |

* cited by examiner

WAVELENGTH CONVERTING LIGHT-EMITTING DEVICES AND METHODS OF MAKING THE SAME

RELATED APPLICATIONS

This application is a divisional of U.S. patent application Ser. No. 12/355,559, filed Jan. 16, 2009, entitled "Wavelength Converting Light-emitting Devices and Methods of Making the Same," which claims the benefit of U.S. Provisional Patent Application Ser. No. 61/021,449, filed Jan. 16, 2008, entitled "Wavelength Converting Light-emitting Devices and Methods of Making the Same," which are incorporated herein by reference in their entirety for all purposes.

FIELD OF THE INVENTION

The present embodiments are drawn generally towards wavelength converting light-emitting devices and methods of making the same. Specifically, the embodiments relate to wafer-level deposition of wavelength converting material.

BACKGROUND

A light-emitting diode (LED) can provide light in a more efficient manner than an incandescent and/or a fluorescent light source. The relatively high power efficiency associated with LEDs has created an interest in using LEDs to displace conventional light sources in a variety of lighting applications. For example, in some instances LEDs are being used as traffic lights and to illuminate cell phone keypads and displays.

Typically, an LED is formed of multiple layers, with at least some of the layers being formed of different materials. In general, the materials and thicknesses selected for the layers influence the wavelength(s) of light emitted by the LED. In addition, the chemical composition of the layers can be selected to promote isolation of injected electrical charge carriers into regions (e.g., quantum wells) for relatively efficient conversion to light. Generally, the layers on one side of the junction where a quantum well is grown are doped with donor atoms that result in high electron concentration (such layers are commonly referred to as n-type layers), and the layers on the opposite side are doped with acceptor atoms that result in a relatively high hole concentration (such layers are commonly referred to as p-type layers).

LEDs also generally include contact structures (also referred to as electrical contact structures or electrodes), which are conductive features of the device that may be electrically connected to a power source. The power source can provide electrical current to the device via the contact structures, e.g., the contact structures can deliver current along the lengths of structures to the surface of the device within which light may be generated.

In addition, light-emitting devices may include a wavelength-converting region (e.g., phosphor region). For example, the wavelength converting material (e.g., phosphor) may be in the form of particles distributed in a second material (e.g., an encapsulant or adhesive, such as epoxy) to form a composite structure. Wavelength-converting regions can absorb light from a light-generating region (e.g., semiconductor region within an LED) and emit light having a different wavelength. As a result, a light-emitting device incorporating a wavelength-converting region can emit light having wavelength(s) that may not be possible using an LED without such regions.

SUMMARY

Wavelength converting light-emitting devices and methods of making the same are provided.

In some embodiments, a method of making a wavelength converting light-emitting device is provided. The method comprises providing a light-emitting device having a light-emitting surface and disposing a mask layer over the light-emitting surface. The mask layer exposes a portion of the light-emitting surface. The method further comprises disposing a wavelength converting layer over the mask layer and the portion exposed by the mask layer of the light-emitting surface.

In some embodiments, a method of making a wavelength converting light-emitting device is provided. The method comprises providing a light-emitting device having a light-emitting surface; and spin coating a wavelength converting layer on the light-emitting surface.

In some embodiments, a light-emitting device is provided. The device comprises a multi-layer stack of materials including a light-generating region and a light-emitting surface. The device further comprises at least one electrically conductive bond pad disposed on the light-emitting surface and a wavelength converting layer disposed over the light-emitting surface. The wavelength converting layer comprises a wavelength converting material and a spin-on-glass.

In some embodiments, a light-emitting device is provided. The device comprises a multi-layer stack of materials including a light-generating region and a light-emitting surface. The device further comprises at least one electrically conductive bond pad disposed on the light-emitting surface and a wavelength converting layer disposed over the light-emitting surface. The wavelength converting layer is separated from the bond pad by a distance less than or equal to 0.025 times the length of an edge of the light-emitting device.

Other aspects, embodiments and features of the invention will become apparent from the following detailed description of the invention when considered in conjunction with the accompanying figures. The accompanying figures are schematic and are not intended to be drawn to scale. In the figures, each identical or substantially similar component that is illustrated in various figures is represented by a single numeral or notation.

For purposes of clarity, not every component is labeled in every figure. Nor is every component of each embodiment of the invention shown where illustration is not necessary to allow those of ordinary skill in the art to understand the invention. All patent applications and patents incorporated herein by reference are incorporated by reference in their entirety. In case of conflict, the present specification, including definitions, will control.

DETAILED DESCRIPTION

Current wavelength converting material (e.g., phosphor) deposition processes include chip or package level processing and which can result in CIE coordinates and color temperature (CCT) after wavelength conversion that are inconsistent and/or difficult to control. In some embodiments presented herein, methods are provided for depositing a wavelength converting material (e.g., phosphors) layer onto light-emitting (e.g., LED) devices. For example, the wavelength converting material layer can be deposited on the emission surface of the light-emitting devices. In some cases, the wavelength converting material layer is deposited on a wafer that is subsequently processed to form multiple light-emitting devices. Such methods can shorten the device fabrication cycle time and minimize discrepancies in desired optical properties after wavelength conversion, such as CIE coordinates and CCT.

The wavelength-converting layer is a region that can include one or more wavelength-converting materials that can convert the wavelength of absorbed light. The wavelength-converting materials can function by absorbing light having a first wavelength and emitting light having a second wavelength (e.g., longer wavelengths). In some preferred embodiments, the wavelength-converting region includes a phosphor material. The phosphor material can be present in particulate form. The particles may be distributed in a second material (e.g., an encapsulant or adhesive, such as epoxy) to form a composite structure.

Any suitable phosphor material may be used. In some embodiments, the phosphor material may be a yellow phosphor material (e.g., $(Y,Gd)(Al,Ga)G:Ce^{3+}$, sometimes referred to as a "YAG" (yttrium, aluminum, garnet) phosphor), a red phosphor material (e.g., $L_2O_2S:Eu^{3+}$), a green phosphor material (e.g., ZnS:Cu,Al,Mn), and/or a blue phosphor material (e.g., $(Sr,Ca,Ba,Mg)_{10}(PO_4)_6Cl:Eu^{2+}$). Other phosphor materials are also possible. Suitable phosphor materials have been described, for example, in U.S. Pat. No. 7,196,354, filed Sep. 29, 2005, entitled "Wavelength-converting Light-emitting Devices," by Erchak, et al., which is incorporated herein by reference in its entirety. As described further below, in some embodiments, wavelength converting material particles are mixed with Spin-on-glass (SOG) material and subsequently spun onto LED wafer. In some embodiments, S-O-G (Futurrex, IC1-200) can be used as the binding material for wavelength converting material, such as phosphor. In some embodiments, no silicone material is present in this process. In some embodiments, wavelength converting material particles are mixed with silicone material and subsequently spun onto LED wafer. In some embodiments, wavelength converting material particles are mixed with epoxy material and subsequently spun onto LED wafer. In addition to spin coating, the wavelength converting material (and any additional elements such as silicone material, epoxy, S-O-G, etc.) may be deposited via spray-coating, ink-jet printing, screen printing, among other methods. In some embodiments, a mixture of wavelength converting material powder (e.g., YAG:Ce powder with average particle size 1-10 um, which can be obtained from Phosphor Technology Corp.) and S-O-G (e.g., in a ratio of 1 g:1.5 ml, in a ratio of 0.5-0.7 g:1 ml) can be applied to wafers.

In some embodiments, the average particle size of the wavelength converting powder may be less than 100 micron. In some embodiments, the average particle size is less than 30 micron. In some embodiments, the average particle size of the wavelength converting material powder may be between about 1 and 10 microns, between about 4 and 16 microns, between about 10 and 30 microns, or between about 30 and 100 microns. It should be understood that other particle sizes are also possible than the ranges described herein.

In addition, the ratio of wavelength converting material to binder may vary. For example, the ratio of wavelength converting material to binder may be at least about 0.1 g/mL, at least 0.5 g/mL, at least 1 g/mL, at least 2 g/mL, or higher. Good uniformity and thickness can be obtained, as with well known spin-coating processes for other materials. Dense films may be obtained as shown by SEM images showing that the wavelength converting material particles are densely packed. Pre-baked S-O-G can serve as a strong binding material. In some embodiments, wafers can undergo quick dump rinsing, spin rinse drying, and/or laser dicing without noticeable wavelength converting material loss. In some embodiments, bond pad(s) can be protected during wavelength converting material layer application (e.g., phosphor layer application) by a mask layer over the bond pad(s). The mask layer can be formed using photolithography. In some embodiments, mask layer lift-off was performed to remove the mask layer and any wavelength converting material layer over the mask layer (e.g., using acetone, soaking for 10-30 minutes with gentle agitation).

Figure 1:
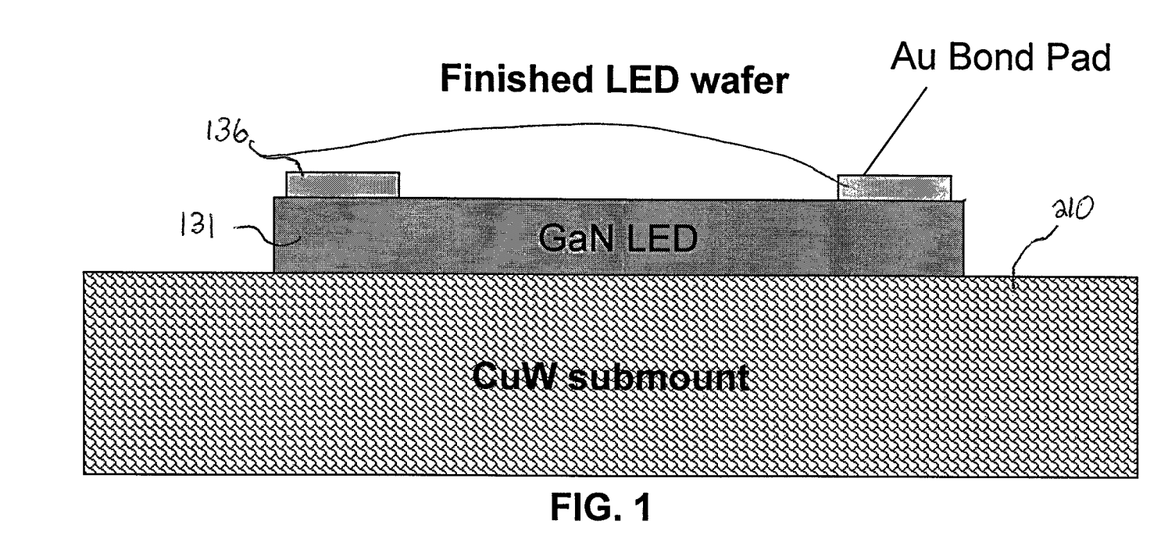
FIG. 1 illustrates an LED die mounted onto a submount wafer.

FIG. 1 illustrates an LED die 131 mounted onto a submount wafer 210. The submount wafer 210 can include a metal submount, such as a copper or copper tungsten submount. An example of an LED die 131 is described in detail in relation to FIG. 8. The submount wafer 210 can have a plurality of attached LED dies. Such a configuration can be formed by mounting the LED dies to the submount wafer 210.

Attaching semiconductor LED dies to a submount wafer can include bonding a semiconductor LED wafer to the submount wafer. The semiconductor LED wafer can include a plurality of LED regions separated by mesa streets. The mesa streets may be, for example, etched to separate the dice or filled with a material (e.g., $SiO_2$) and subsequently cut using a die saw. In some embodiments, the semiconductor LED wafer can include a substrate and a plurality of semiconductor LEDs. The semiconductor LEDs can be supported on a substrate comprising a different material. In some embodiments, the substrate on which the semiconductor LEDs can be supported comprises a sapphire substrate, and the semiconductor LEDs can be GaN-based LEDs (e.g., which can include Al, Ga, N, and/or In). The semiconductor LEDs can be transferred from the starting support substrate to the submount wafer using any layer transfer process. Layer transfer can be accomplished via one or more techniques, including but not limited to ion-cut, laser liftoff, and/or etch liftoff. Laser liftoff processes are disclosed, for example, in U.S. Pat. Nos. 6,420,242 and 6,071,795, which are hereby incorporated by reference in their entirety. Etch liftoff processes may involve the use of a buried etch layer that is selectively etched laterally so as to result in layer transfer of layers disposed over the buried etch layer. Ion-cut processes can involve the use of implantation to form a weakened area at which splitting can be induced.

After layer transfer, electrically conductive bond pads 136 can be formed on the surface of the LED dies. In some embodiments, the bond pads 136 can be formed of any suitable metal, for example, the bond pads can comprise gold (Au). Bond pads can be utilized to provide for electrical connection to the top surface of the semiconductor LED structure. For example, wire-bonds can be attached to the bond pads and can provide current to bond pads. Electrically conductive fingers and/or a current spreading layer on the surface of the semiconductor LED structure can provide for current spreading across the entire LED. In some embodiments, as described further below, no bond pads may be present on the emission surface.

Figure 2:
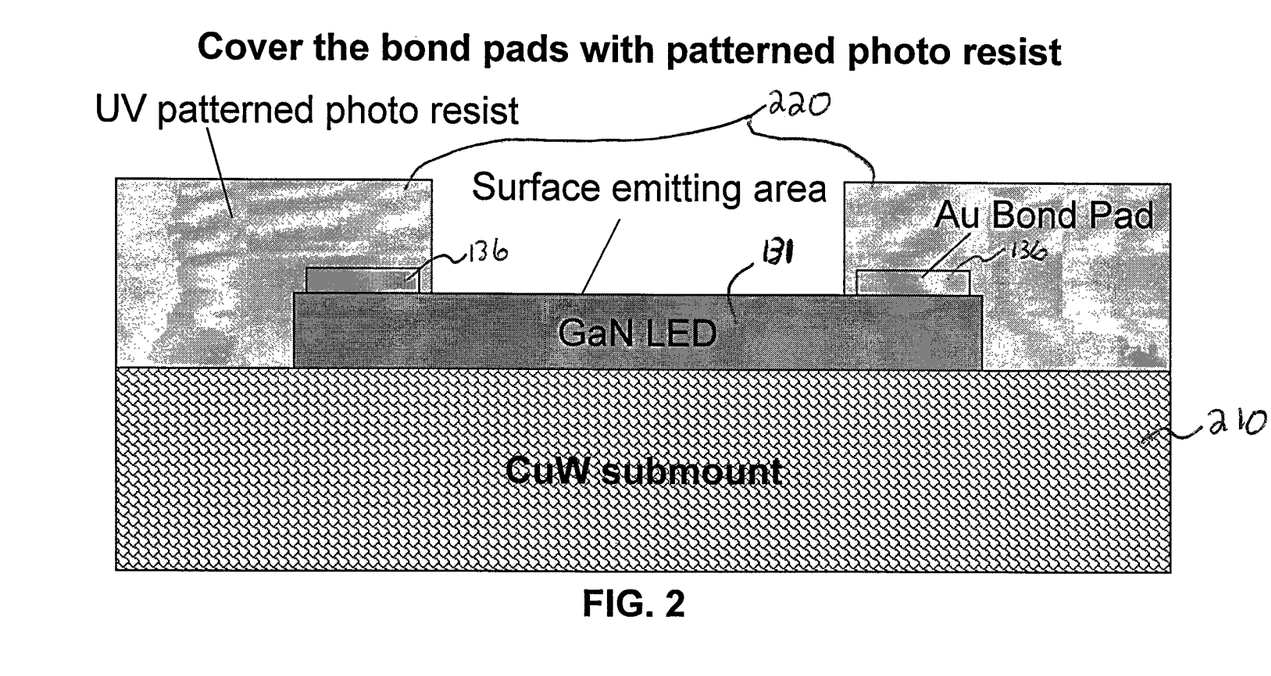
FIG. 2 illustrates an intermediate structure whereby a mask layer is formed on the surface of the structure of FIG. 1.

FIG. 2 illustrates a first intermediate structure whereby a mask layer 220 is formed on the surface of the structure of FIG. 1, namely on the surface of the LED(s) on submount. The mask layer 220 can be patterned (e.g., via photolithography processes) to expose a surface light-emitting area of the LED 131. In some embodiments, the mask layer can have a thickness of between about 10 microns to about 30 microns. In other embodiments, the mask layer may have a thickness of up to about 50 microns, up to about 100 microns, up to about 150 microns, or thicker. In some embodiments, the mask layer 220 can comprises a photo-resist. The photo-resist can include a UV (ultraviolet) sensitive photoresist, however, it should be appreciated that the embodiments are not limited to just a UV sensitive photo-resist, and any patternable mask can be used.

Figure 3:
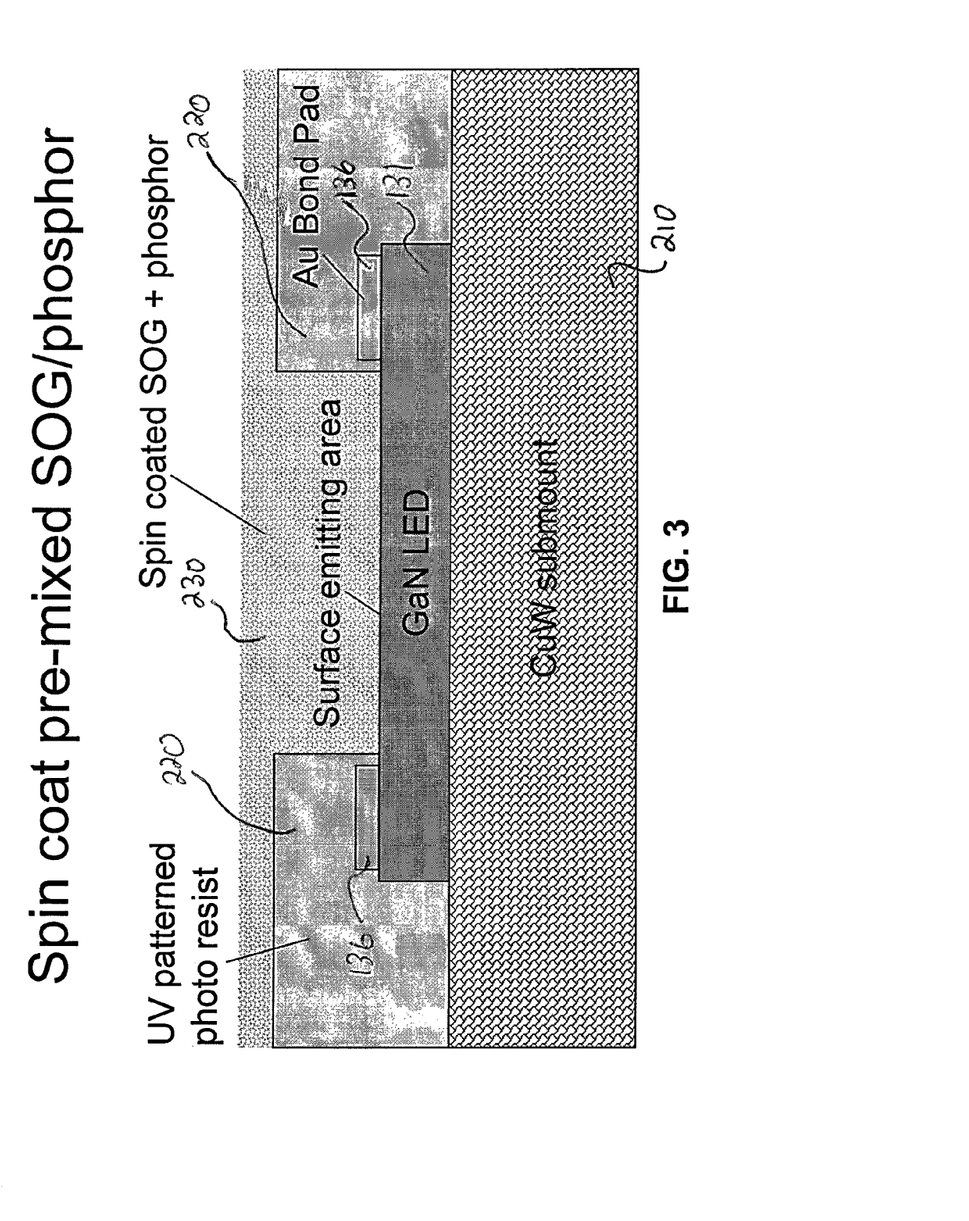
FIG. 3 illustrates an intermediate structure that can be formed by disposing a wavelength converting material layer over the structure of FIG. 2.

FIG. 3 illustrates a second intermediate structure that can be formed by disposing a wavelength converting material layer 230 over the structure of FIG. 2. The wavelength converting material layer 230 can comprise a wavelength converting material and a binding material. In some embodiments, the wavelength converting material comprises one or more phosphors, such as one or more types of phosphor particles (e.g., yellow phosphor, red phosphor, green phosphor, etc.). In some embodiments, the wavelength converting material comprises nanoparticles. In some embodiments, the wavelength converting material layer 230 is a porous layer. A porous wavelength converting material layer 230 can allow a liftoff solution (e.g., acetone solution) to penetrate the wavelength converting material layer and undercut a mask layer underneath.

In some embodiments, the binding material can comprise a Spin-on-glass (SOG) material. In some embodiments, wavelength converting material particles can be mixed with Spin-on-glass (SOG) material and subsequently deposited (e.g., spin-coated, spray-coated, ink-jet printed, screen printed, etc.) onto the wafer (e.g., submount wafer) that supports the LED dies. In some embodiments, the wavelength converting material particles may also be mixed with silicones and/or epoxy. In some embodiments, S-O-G (Futurrex, IC1-200) can be used as the binding material for wavelength converting material, such as phosphor. In some cases, the binder material may be selected to have a viscosity that is favorable in light of the deposition method selected (e.g., spin coating, etc.). The viscosity of the binder may also be tailored, in some cases, via pretreatment before mixing with the wavelength converting material. In some embodiments, a mixture of wavelength converting (e.g., phosphor) powder (e.g., YAG:Ce with average particle size 2-10 um) and S-O-G) can be applied to wafers. For example, the mixing ratio of phosphor to S-O-G may be between 0.1 g/mL to 2 g/mL. Other mixing ratios that are greater than or less than this range is also possible.

Figure 4A:
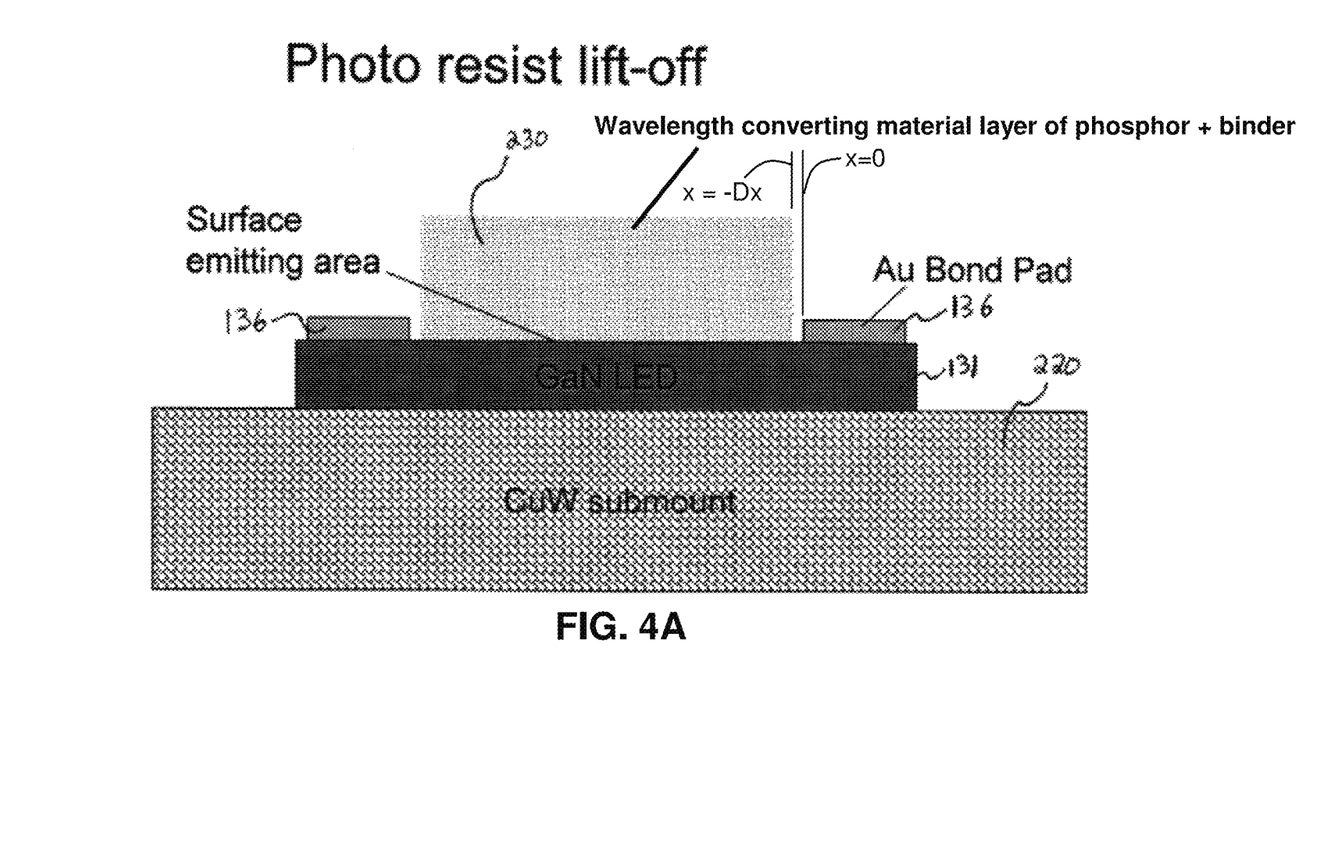
FIGS. 4A-4B illustrate an intermediate structure that can be formed by performing liftoff off the mask layer of the structure of FIG. 3.

FIG. 4A illustrates a third intermediate structure that can be formed by performing liftoff of the mask layer 220 of the structure of FIG. 3. A liftoff process can be used to remove the portions of the wavelength converting material layer 230 over the mask layer 220 that is shown in FIG. 3, thereby leaving wavelength converting material layer 230 only over the surface light-emitting area of LED die 131 as shown in FIG. 4A. Any suitable liftoff process may be used. In some embodiments, the lift-off of the mask layer 220 can be performed by placing the wafer in a lift-off solution. In some embodiments, the lift-off solution is an acetone-based solution, for example, when the mask layer comprises a photo-resist. The lift-off solution can cause the delamination of the mask layer from the underlying surface to which the mask layer is bonded. In some embodiments, the underlying surface to which the mask layer is bonded comprises a metal surface (e.g., part of a metal submount wafer). The liftoff time will depend on the specific liftoff process. For example, the liftoff time may be between 1 and 30 minutes.

The techniques described herein can enable formation of wavelength converting material layers that have uniform thicknesses. For example, the layers may have a thickness variation of less than 100%, or less than 50%, the average thickness of the layer. In some cases, the wavelength converting material layer is more uniform. For example, the thickness variation is less than 30%; less than 20%; less than 10% or even less than 5%, the average thickness of the layer.

In some embodiments the mask layer can be designed to leave a small region between the bond pad and the light emitting area free of wavelength converting material (e.g., Dx<0 as in FIG. 4A). In some embodiments, the magnitude (Dx) of separation between the bond pad and the wavelength converting material is less than or equal to 0.005 times the length of the edge of the LED die. In some embodiments, the magnitude of separation is less than or equal to 0.002 times the length of the edge of the LED die. In some embodiments, the magnitude of separation is less than or equal to 0.025 times the length of the edge of the LED die; or less than or equal to 0.01 times the length of the edge of the LED die. The separation may be, for example, less than or equal to 250 micron, less than or equal to 100 micron, less than or equal to 50 micron, less than or equal to 10 micron, less than or equal to 5 micron, or less than or equal to 1 micron. In some cases, the separation may be essentially zero.

Figure 4B:
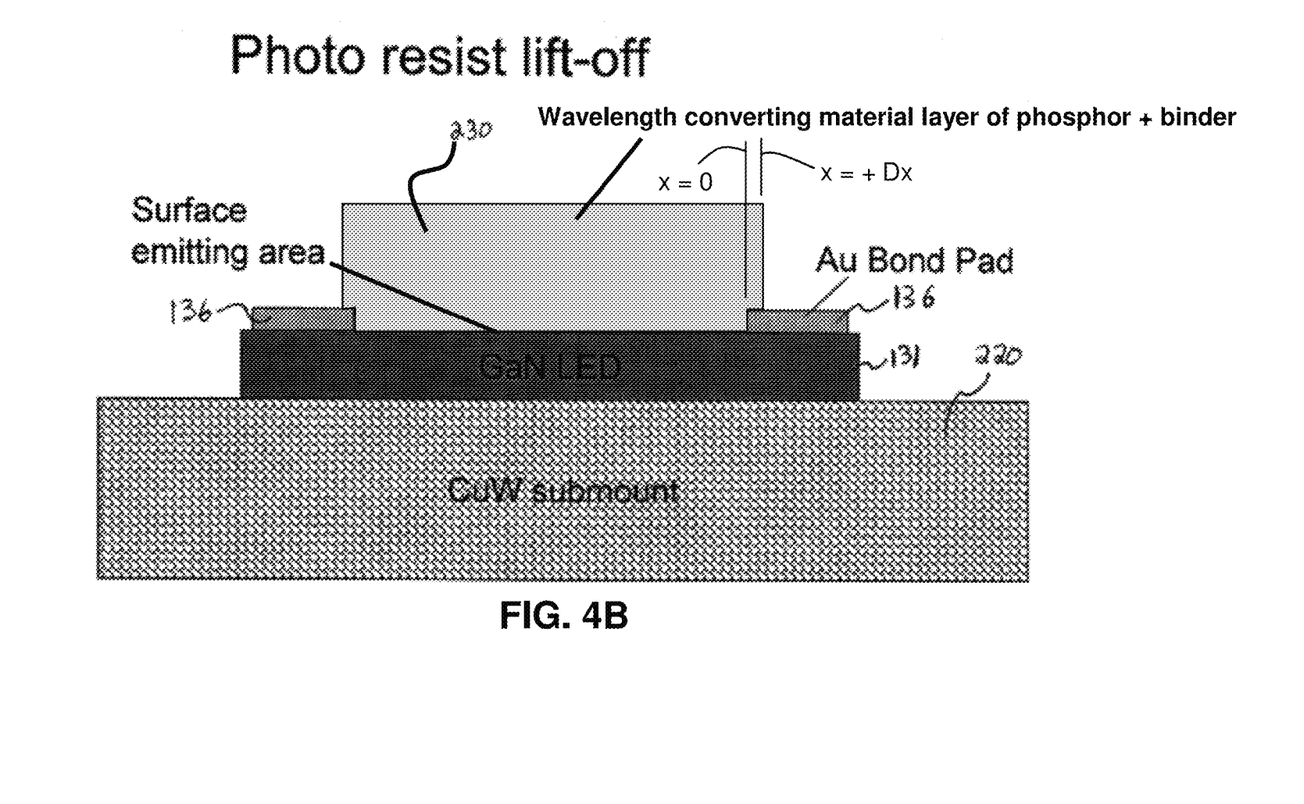

In other embodiments, the mask layer can be designed such that the wavelength converting material extends slightly into the bond pad area to overlap the bond pad by any of the same magnitudes (Dx) noted above (e.g., Dx>0 in FIG. 4B).

It should be understood that other separation and overlap distances are also possible.

Figure 8:
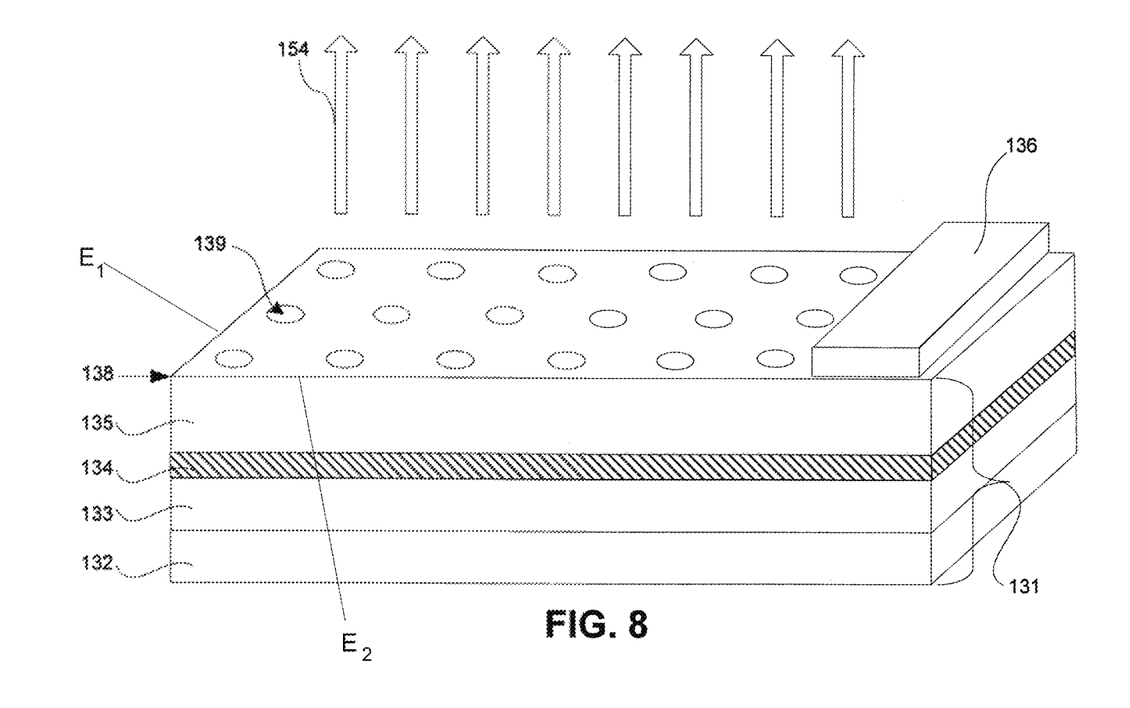
FIG. 8 illustrates a light-emitting die that can include a light-emitting diode.

In this context, the edge of the LED die refers to an edge that defines a plane substantially parallel to the emission surface. As shown in FIG. 8, edges are indicated by E1 and E2.

In some cases, it may be preferable for at least one of the edges of the LED to be at least 1 mm; in some cases, at least 1.5 mm; in some cases, at least 2 mm; in some cases, at least 2.5 mm; in some cases, at least 3 mm; and, in some cases, at least 5 mm. In some embodiments, more than one edge (e.g., all edges) have the edge lengths noted. Such dimensions lead to LEDs, and emission surfaces, having large areas. For example, in some cases, the surface area may be at least 1 mm$^2$; in some cases, at least 2.5 mm$^2$; in some cases, the surface area may be at least 5 mm$^2$; and, in some cases, at least 10 mm$^2$. The techniques described herein may be well-suited for use with large area LEDs. However, it should be understood that the techniques are not limited in this regard.

The methods described herein may advantageously lead to the loss of wavelength converting material during the lift-off process. This is particularly the case when large surface area the LEDs are used. For example, the methods may lead to a phosphor loss of less than 5%, less than 2%, or even less than 1%.

In some embodiments, the mask layer can be removed via etching. The removal of the mask layer can include selective etching using an etchant that does not etch other materials, such as the wavelength converting material layer 230. In some embodiments, wavelength converting material may be deposited over the entire wafer. A protective masking layer may be deposited over the wavelength converting material. In some embodiments, the masking layer may be deposited only over the portions of the masking material that lie over the light-emitting region. In other embodiments, the masking layer may be selectively etched such that only the portion over the light-emitting region remains. Once the protective masking layer has been deposited, the exposed wavelength converting material may be etched, after which the protective masking layer may be removed. For example, the wavelength converting material may be removed from the bond pads.

The process described herein can be used to fabricate a light-emitting device (e.g., LED) including a light-emitting semiconductor structure including a light-emitting surface, at least one electrically conductive bond pad disposed on the light-emitting surface, and a wavelength converting layer disposed over the light-emitting surface, the wavelength converting layer comprising a wavelength converting material and a binder, wherein the wavelength converting layer is absent over the electrically conductive bond pads.

In some embodiments, the process can be used to fabricate an LED that does not have any bond pad on the light emitting surface. For example, such LEDs may include contacts (e.g., n and p contacts) elsewhere on the LED including on the non-light emitting surface of the LED opposite the light-emitting surface.

Figure 5:
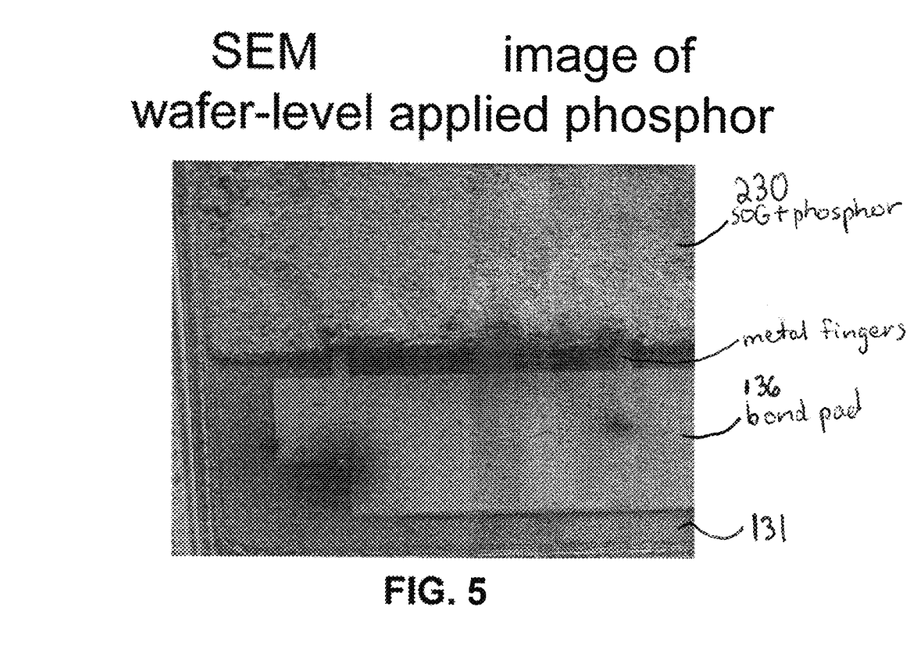
FIGS. 5-6 are scanning electron microscope images of a wavelength converting LED device.
Figure 6:
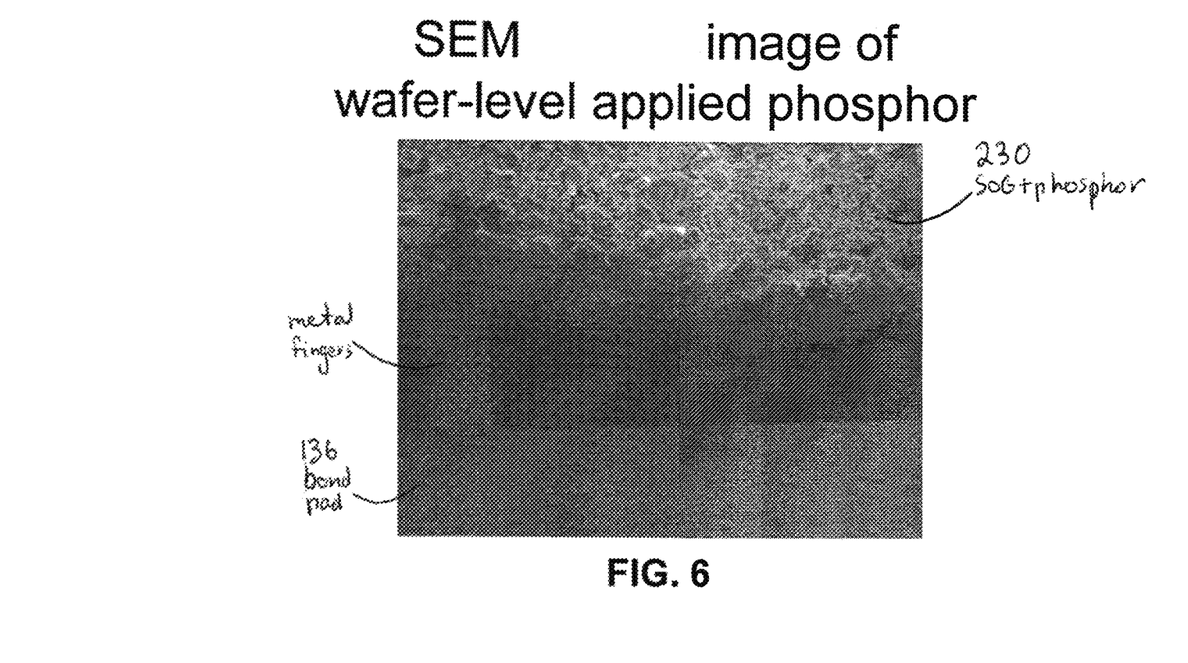

FIG. 5 and FIG. 6 illustrate scanning electron microscope images of a wavelength converting LED device fabricated using the following procedure. Cleaning of wafers was performed in a spin-rinse dry (SRD). A photolithography patterning process was used to cover bond pads with a photo resist mask and while exposing the LED emitting surface. Brandson plasma photolightography descum was performed. A hard bake of the wafers was performed on a hotplate for 5 minutes at 110 degrees Celsius. Phosphor powder and SOG was mixed in a proportion of 0.5 g:1 ml. A drop of about 0.5 ml of the mixture was dispensed onto the target wafer. While 0.5 ml of the mixture was used in this set of embodiments, other embodiments may make use of smaller or larger volumes. In some embodiments, between about 1 mL and about 3 mL, or between about 2 mL and about 5 mL may be used. In some instances, an excess of the mixture may be dispensed onto the target wafer and removed by adjusting the rotation speed of the spin-coating process. The wafer can be rotated slowly until the entire surface is uniformly covered (e.g., 5-10 seconds). The wafer can then be spun at about 150-250 RPM (e.g., up to 500 rpm, up to 1000 rpm, up to 2000 rpm, or greater) for about 30 seconds. The wafer can then be baked on a hotplate for about 3-5 minutes (alternatively, up to 10 minutes, up to 20 minutes) at 65 Celsius (alternatively, up to 75° C., up to 100° C., up to 120° C.) to drive out the solvent in S-O-G. At this point the wavelength converting layer is "soft-cured."

The wafer can then be soaked in acetone for about 10-30 minutes to lift-off the photoresist mask. Spin rinse dry and quick dump rinse can be used to clear the photo residue from the bond pads. The wafer can be baked on a hotplate (or oven) at about 200 Celsius (alternatively, up to 250° C., up to 300° C., up to 400° C., or higher) for about 30 minutes (alternatively, up to 1 hour, 2 hours, or longer). At this point, the wavelength converting layer has been hard cured. It should be understood that other suitable process (e.g., temperature, time) conditions may lead to hard curing. Afterwards, wafers are ready for dicing. In some embodiments, the wavelength converting material layer thickness in the range of 10 microns to 20 microns may be desired for a CCT of about 6500K with a standard YAG:Ce phosphor on a blue LED.

Figure 7:
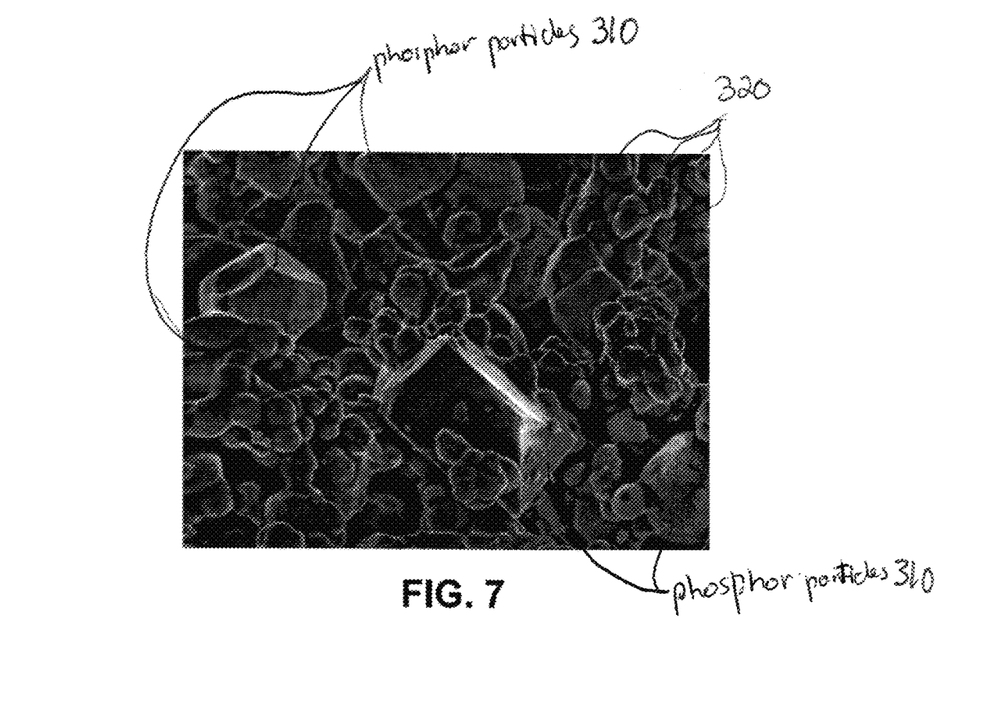
FIG. 7 is a scanning electron microscope image of the wavelength converting material layer.

FIG. 7 illustrates a scanning electron micrograph of the wavelength converting material layer 230. The wavelength converting material layer can include phosphor particles 310 bound together by spin-on-glass particles 320. In the illustrated embodiments, the phosphor particles have a larger size than the spin-on-glass particles. In some embodiments, spin-on-glass particles coat the surface of wavelength converting material particles and provide for binding. The spin-on-glass may not be in particulate form but may form a thin layer on top of phosphor particles and/or fill interstitial regions between the phosphor particles.

In some embodiments, more than one layer of wavelength converting material may be deposited (e.g., multiple layers of the same color, multiple layers each with a unique color, etc.). When multiple layers are present, the layer(s) may have one or more different type of wavelength converting material than the other layer(s). The layers of wavelength converting material may be deposited using one or more masking steps, with or without subsequent removal of the masks between the application of different layers.

It should be noted that additional phosphor materials may be added, in some embodiments, during post-processing packaging. For example, in the case of a device which requires one or more phosphors—minor tuning with a single phosphor may be performed at the package level. In the case of a device which requires multiple phosphors (e.g. a majority of yellow phosphor with a small quantity of a red phosphor to improve the color rendering index of the final device) one phosphor (e.g., the yellow phosphor) could be applied at the wafer level and the other phosphor (e.g., the red phosphor) could be applied in small quantity at the package level. Similarly, additional materials may be added, in some embodiments, on top of the coating at the wafer level, according to the "multi-layer" approach described in the preceding paragraph.

The systems and methods described herein provide several advantages compared to known prior methods. For example, the uniformity of the wavelength converting material layer can be well controlled via spin-coating, ink-jet printing, spray-coating, screen printing, Electro-Phoretic Deposition (EPD), etc. For example, the thickness of spin-coated layers may be controlled by adjusting rotation speed and time. Screen printed layer thickness may be controlled using the mask layer.

The systems and methods described herein also allow for the alignment of patterns on the wafer using existing fabrication equipment that is already used for many common LED fabrication processes, thus eliminating the need for costly equipment upgrades. In addition, the die may be fully tested for color and performance at the die level, prior to packaging, potentially saving the costs associated with packaging a faulty product. The methods described herein also require relatively little material compared to methods which apply phosphor and binder during later packaging processes.

The temperature of the wavelength converting material may be controlled relatively easily, in some embodiments, due to the proximity of the wavelength converting material layer to the die. Many binder materials have lower thermal conductivities than GaN; therefore, the proximity of the wavelength converting material layer to the die allows for a relatively lower temperature of operation in the wavelength converting material layer.

The methods described herein are compatible with etendue-limited dice (without a lens) and with non-etendue-limited dice (with a lens). Generally, relatively thicker wavelength converting material layers are applied to dice in which lenses are to be applied, while relatively thinner wavelength converting material layers are applied to dice in which no lenses are to be applied. A lens may be added to the die at any time after the deposition of the wavelength converting material layer, including after the phosphor coated die has been packaged.

Another advantage of the systems and methods described herein is that the same die design die (e.g., color, size, etc.) can be used in multiple package configurations (e.g., chip-on-board, surface-mount, multi-chip package, etc.) without the need to develop a unique assembly infrastructure for phosphor deposition and control for each package configuration, thus reducing costs.

Figure 9:
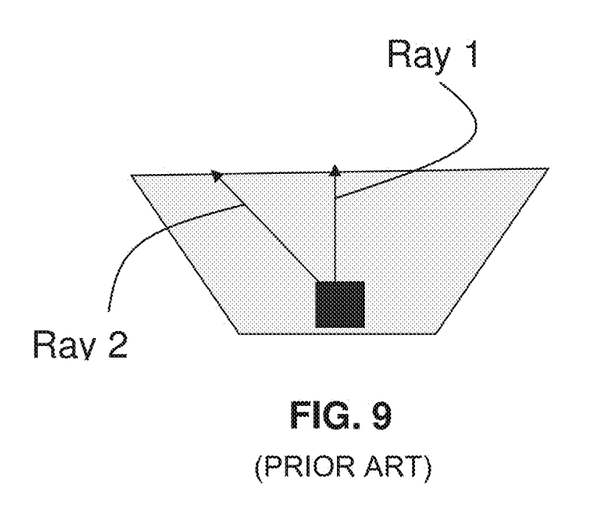
FIG. 9 illustrates a conventional packaged LED emitting two rays of light at different angles.

Color uniformity in the far field pattern of a phosphor-converted LED may be difficult to obtain in conventional LEDs, particularly when phosphor is applied at the package level. For example, in conventional designs in which an LED is much smaller than the package size, the LED effectively acts as a point source within the package; hence, rays traveling directly up and out of the LED traverse a shorter path through the phosphor than rays traveling at an angle. For example, Ray 2 in FIG. 9 traverses a longer patch than Ray 1. Longer path lengths (e.g., the path traveled by Ray 2) lead to greater absorption of the light by the wavelength converting material. For a white LED, with a blue LED and yellow phosphor, the resulting color in the far field has less blue at high angles (e.g., extended projection of Ray 2) than at normal incidence (e.g., extended projection of Ray 1). This may result in poor color uniformity in such conventional design.

In some embodiments, the methods described in this application can improve color uniformity, for example, because the wavelength converting material may be disposed of the light emitting surface of the LED. The optical path length through the wavelength converting material phosphor is, thus, small. This improves the uniformity of the far field color distribution. This is particularly true for LEDs having a large surface emission area as described above.

FIG. 8 illustrates a light-emitting die that can include a light-emitting diode (LED) that may be used in connection with the embodiments described above. It should be understood that various embodiments presented herein can also be applied to other light-emitting dies, such as laser diode dies, and LED dies having different structures (such as organic LEDs, also referred to as OLEDs).

Suitable phosphor materials have been described, for example, in U.S. Pat. No. 7,196,354, filed Sep. 29, 2005, entitled "Wavelength-converting Light-emitting Devices," by Erchak, et al., which is incorporated herein by reference in its entirety.

The LED die shown in FIG. 8 comprises a multi-layer stack 131 that may be disposed on a support structure (not shown), such as a submount (e.g., a metal submount). The multi-layer stack 131 can include an active region 134 which can be formed between n-doped layer(s) 135 and p-doped layer(s) 133. The stack can also include an electrically conductive layer 132 which may serve as a p-side contact and/or as an optically reflective layer. An n-side contact pad 136 may be disposed on layer 135. Electrically conductive fingers (not shown) and/or a current spreading layer (e.g., transparent conductive layer, such as a transparent conductive oxide) may extend from the contact pad 136 and along light emission surface 138, thereby allowing for uniform current injection into the LED structure.

It should be appreciated that the LED is not limited to the configuration shown in FIG. 8, for example, the n-doped and p-doped sides may be interchanged so as to form a LED having a p-doped region in contact with contact pad 136 and an n-doped region in contact with layer 132. As described further below, electrical potential may be applied to the contact pads which can result in light generation within active region 134 and emission (represented by arrows 154) of at least some of the light generated through light emission surface 138. As described further below, holes 139 may be defined in an emission surface to form a pattern that can influence light emission characteristics, such as light extraction and/or light collimation. It should be understood that other modifications can be made to the representative LED structure presented, and that embodiments are not limited in this respect.

The active region of an LED can include one or more quantum wells surrounded by barrier layers. The quantum well structure may be defined by a semiconductor material layer (e.g., in a single quantum well), or more than one semiconductor material layers (e.g., in multiple quantum wells), with a smaller electronic band gap as compared to the barrier layers. Suitable semiconductor material layers for the quantum well structures can include InGaN, AlGaN, GaN and combinations of these layers (e.g., alternating InGaN/GaN layers, where a GaN layer serves as a barrier layer). In general, LEDs can include an active region comprising one or more semiconductors materials, including III-V semiconductors (e.g., GaAs, AlGaAs, AlGaP, GaP, GaAsP, InGaAs, InAs, InP, GaN, InGaN, InGaAlP, AlGaN, as well as combinations and alloys thereof), II-VI semiconductors (e.g., ZnSe, CdSe, ZnCdSe, ZnTe, ZnTeSe, ZnS, ZnSSe, as well as combinations and alloys thereof), and/or other semiconductors. Other light-emitting materials are possible such as quantum dots or organic light-emission layers.

The n-doped layer(s) 135 can include a silicon-doped GaN layer (e.g., having a thickness of about 4000 nm thick) and/or the p-doped layer(s) 133 can include a magnesium-doped GaN layer (e.g., having a thickness of about 40 nm thick). The electrically conductive layer 132 may be a reflective layer, such as a silver-containing layer (e.g., having a thickness of about 100 nm), which may reflects upwards any downward propagating light generated by the active region 134. Furthermore, although not shown, other layers may also be included in the LED; for example, an AlGaN layer may be disposed between the active region 134 and the p-doped layer(s) 133. It should be understood that compositions other than those described herein may also be suitable for the layers of the LED.

As a result of holes 139, the LED can have a dielectric function that varies spatially according to a pattern. Typical hole sizes can be less than about one micron (e.g., less than about 750 nm, less than about 500 nm, less than about 250 nm) and typical nearest neighbor distances between holes can be less than about one micron (e.g., less than about 750 nm, less than about 500 nm, less than about 250 nm). Furthermore, as illustrated in the figure, the holes 139 can be non-concentric.

The dielectric function that varies spatially according to a pattern can influence the extraction efficiency and/or collimation of light emitted by the LED. In some embodiments, a layer of the LED may have a dielectric function that varies spatially according to a pattern. In the illustrative LED die of FIG. 8, the pattern is formed of holes, but it should be appreciated that the variation of the dielectric function at an interface need not necessarily result from holes. Any suitable way of producing a variation in dielectric function according to a pattern may be used. The pattern may be periodic (e.g., having a simple repeat cell, or having a complex repeat super-cell), or non-periodic. As referred to herein, a complex periodic pattern is a pattern that has more than one feature in each unit cell that repeats in a periodic fashion. Examples of complex periodic patterns include honeycomb patterns, honeycomb base patterns, (2×2) base patterns, ring patterns, and Archimedean patterns. In some embodiments, a complex periodic pattern can have certain holes with one diameter and other holes with a smaller diameter. As referred to herein, a non-periodic pattern is a pattern that has no translational symmetry over a unit cell that has a length that is at least 50 times the peak wavelength of light generated by one or more light-generating portions. As used herein, peak wavelength refers to the wavelength having a maximum light intensity, for example, as measured using a spectroradiometer. Examples of non-periodic patterns include aperiodic patterns, quasi-crystalline patterns (e.g., quasi-crystal patterns having 8-fold symmetry), Robinson patterns, and Amman patterns. A non-periodic pattern can also include a detuned pattern (as described in U.S. Pat. No. 6,831,302 by Erchak, et al., which is incorporated herein by reference in its entirety). In some embodiments, the LED may include a roughened surface. In some cases, the LED may include a surface that is roughened but not patterned.

In certain embodiments, an interface of a light-emitting device is patterned with holes which can form a photonic lattice. Suitable LEDs having a dielectric function that varies spatially (e.g., a photonic lattice) have been described in, for example, U.S. Pat. No. 6,831,302 B2, entitled "Light emitting devices with improved extraction efficiency," filed on Nov. 26, 2003, which is herein incorporated by reference in its entirety. A high extraction efficiency for an LED implies a high power of the emitted light and hence high brightness which may be desirable in various optical systems.

Light may be generated by the LED as follows. The p-side contact layer can be held at a positive potential relative to the n-side contact pad, which causes electrical current to be injected into the LED. As the electrical current passes through the active region, electrons from n-doped layer(s) can combine in the active region with holes from p-doped layer(s), which can cause the active region to generate light. The active region can contain a multitude of point dipole radiation sources that generate light with a spectrum of wavelengths characteristic of the material from which the active region is formed. For InGaN/GaN quantum wells, the spectrum of wavelengths of light generated by the light-generating region can have a peak wavelength of about 445 nanometers (nm) and a full width at half maximum (FWHM) of about 30 nm, which is perceived by human eyes as blue light. The light emitted by the LED may be influenced by any patterned surface through which light passes, whereby the pattern can be arranged so as to influence light extraction and/or collimation.

In other embodiments, the active region can generate light having a peak wavelength corresponding to ultraviolet light (e.g., having a peak wavelength of about 370-390 nm), violet light (e.g., having a peak wavelength of about 390-430 nm), blue light (e.g., having a peak wavelength of about 430-480 nm), cyan light (e.g., having a peak wavelength of about 480-500 nm), green light (e.g., having a peak wavelength of about 500 to 550 nm), yellow-green (e.g., having a peak wavelength of about 550-575 nm), yellow light (e.g., having a peak wavelength of about 575-595 nm), amber light (e.g., having a peak wavelength of about 595-605 nm), orange light (e.g., having a peak wavelength of about 605-620 nm), red light (e.g., having a peak wavelength of about 620-700 nm), and/or infrared light (e.g., having a peak wavelength of about 700-1200 nm).

In certain embodiments, the LED may emit light having a high light output power. As previously described, the high power of emitted light may be a result of a pattern that influences the light extraction efficiency of the LED. For example, the light emitted by the LED may have a total power greater than 0.5 Watts (e.g., greater than 1 Watt, greater than 5 Watts, or greater than 10 Watts). In some embodiments, the light generated has a total power of less than 100 Watts, though this should not be construed as a limitation of all embodiments. The total power of the light emitted from an LED can be measured by using an integrating sphere equipped with spectrometer, for example a SLM12 from Sphere Optics Lab Systems. The desired power depends, in part, on the optical system that the LED is being utilized within.

The light generated by the LED may also have a high total power flux. As used herein, the term "total power flux" refers to the total optical power divided by the light emission area. In some embodiments, the total power flux is greater than 0.03 Watts/mm$^2$, greater than 0.05 Watts/mm$^2$, greater than 0.1 Watts/mm$^2$, or greater than 0.2 Watts/mm$^2$. However, it should be understood that the LEDs used in systems and methods presented herein are not limited to the above-described power and power flux values.

In some embodiments, the LED may be associated with one or more wavelength converting regions. The wavelength converting region(s) may include one or more phosphors and/or quantum dots. The wavelength converting region(s) can absorb light emitted by the light-generating region of the LED and emit light having a different wavelength than that absorbed. In this manner, LEDs can emit light of wavelength(s) (and, thus, color) that may not be readily obtainable from LEDs that do not include wavelength converting regions. In some embodiments, one or more wavelength converting regions may be disposed over (e.g., directly on) the emission surface (e.g., surface 38) of the light-emitting device. In some embodiments that include more than one wavelength converting region, the regions may be formed sequentially as layers on one another. Such layers may be patterned selectively at the same time or in different patterning steps. In some embodiments, more than one wavelength converting region may be deposited in different regions on the emission surface. In cases with more than one wavelength converting region, respective regions may include different types of wavelength converting material (e.g., different types of phosphor), or respective regions may include the same type of wavelength converting material. In some embodiments, the different wavelength converting regions may have different thicknesses, though the thicknesses may be similar in other embodiments.

As used herein, when a structure (e.g., layer, region) is referred to as being "on", "over" "overlying" or "supported by" another structure, it can be directly on the structure, or an intervening structure (e.g., layer, region) also may be present. A structure that is "directly on" or "in contact with" another structure means that no intervening structure is present.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A method of making a wavelength converting LED die, the method comprising:
    providing an LED die having a light-emitting surface and at least one electrically conductive bond pad disposed on the light-emitting surface;
    disposing a mask layer over the light-emitting surface, wherein the mask layer exposes a portion of the light-emitting surface and covers the bond pad;
    disposing a wavelength converting layer over the mask layer and the portion exposed by the mask layer of the light-emitting surface; and
    lifting-off the mask layer so as to also remove the wavelength converting layer disposed over the mask layer including the mask layer covering the bond pad to expose the bond pad, while leaving the wavelength converting layer disposed over the exposed portion of the light-emitting surface.

2. The method of claim 1, wherein the wavelength converting LED die is configured to emit substantially white light.

3. The method of claim 1, wherein the wavelength converting layer comprises a wavelength converting material and a second material.

4. The method of claim 3, wherein the second material comprises a spin-on-glass.

5. The method of claim 1, wherein the wavelength converting material comprises one or more phosphors.

6. The method of claim 1, wherein providing the LED die having the light-emitting surface comprises providing a wafer including a plurality of LED die, each LED die having a light-emitting surface.

7. The method of claim 6, wherein disposing the mask layer comprises disposing the mask layer over the wafer.

8. The method of claim 6, wherein disposing the wavelength converting layer comprises disposing the wavelength converting material over the wafer.

9. The method of claim 1, wherein disposing the wavelength converting layer comprises a technique selected from the group consisting of spin coating, screen printing or spray coating.

10. The method of claim 1, wherein the wavelength converting layer has an average thickness and a thickness uniformity of less than 30% the average thickness.

11. The method of claim 1, further comprising disposing a second wavelength converting layer over the first wavelength converting layer.

12. The method of claim 1, wherein disposing the wavelength converting layer comprises spin coating the wavelength converting layer.

13. The method of claim 12, further comprising forming a second bond pad on the light-emitting surface.

14. The method of claim 1, wherein the LED die has an edge and the wavelength converting layer is separated from the bond pad by a distance less than or equal to 0.005 times the length of the edge.

15. The method of claim 1, wherein the LED die has an edge of at least 1 mm.

16. The method of claim 1, further comprising disposing a mask layer over the light-emitting surface prior to spin coating a wavelength converting layer, wherein the mask layer exposes a portion of the light-emitting surface.

17. The method of claim 13, wherein the wavelength converting layer has an average thickness and a thickness uniformity of less than 30% the average thickness.

18. The method of claim 13, further comprising disposing a second wavelength converting layer over the first wavelength converting layer.

19. The method of claim 12, wherein the LED die has a surface area of at least 1 $mm^2$.

20. The method of claim 12, wherein the wavelength converting layer comprises a phosphor and a spin-on glass.

21. The method of claim 20, wherein the ratio of the phosphor to the spin-on glass is between 0.1-2 g/mL.

* * * * *